United States Patent
Seon et al.

(10) Patent No.: US 11,870,043 B2
(45) Date of Patent: Jan. 9, 2024

(54) WIRELESS BATTERY MANAGEMENT SYSTEM, MANAGER NODE FOR THE SAME, AND METHOD OF OPERATING CHANNEL

(71) Applicant: SILICON WORKS CO., LTD., Daejeon (KR)

(72) Inventors: Yong Ju Seon, Daejeon (KR); Heung Lyeol Lee, Daejeon (KR); Seung Jun Choi, Daejeon (KR); Deog Soo Kim, Daejeon (KR); Hee Jin Lee, Daejeon (KR); Jong Chan Kim, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 498 days.

(21) Appl. No.: 17/005,842

(22) Filed: Aug. 28, 2020

(65) Prior Publication Data

US 2021/0066763 A1    Mar. 4, 2021

(30) Foreign Application Priority Data

Aug. 30, 2019    (KR) .................... 10-2019-0106984
Aug. 10, 2020    (KR) .................... 10-2020-0100107

(51) Int. Cl.
     *H01M 10/42*      (2006.01)
     *H04W 4/80*      (2018.01)
     *G01R 31/371*      (2019.01)
     *H04W 4/70*      (2018.01)

(52) U.S. Cl.
CPC ...... *H01M 10/4257* (2013.01); *G01R 31/371* (2019.01); *H04W 4/70* (2018.02); *H04W 4/80* (2018.02); *H01M 2010/4271* (2013.01); *H01M 2010/4278* (2013.01)

(58) Field of Classification Search
CPC .......... H01M 10/4257; H01M 10/425; H01M 2010/4271; H01M 2010/4278; H04W 4/70; H04W 4/80; G01R 31/371
See application file for complete search history.

(56) References Cited

U.S. PATENT DOCUMENTS

| | | | |
|---|---|---|---|
| 10,182,456 B2 | 1/2019 | Damnjanovic et al. | |
| 11,115,921 B2* | 9/2021 | Hartman | G05B 19/042 |
| 2018/0198556 A1* | 7/2018 | Yerramalli | H04W 16/14 |

FOREIGN PATENT DOCUMENTS

KR      10-1816567 B1    2/2018

* cited by examiner

*Primary Examiner* — Raymond Alejandro
(74) *Attorney, Agent, or Firm* — ROTHWELL, FIGG, ERNST & MANBECK, P.C.

(57) ABSTRACT

A wireless battery management system, a manager node for the same, and a channel operating method, which operate a channel so as to stably support wireless communication in the wireless battery management system, are provided. The wireless battery management system includes a manager node and a monitor node. The manager node establishes a first network being a short-range wireless network by using at least one of a first channel and a second channel, and when a second network using the same communication channel and modulation method as a communication channel and a modulation method of the first network is detected, changing the first channel to a third channel and changing the second channel to a fourth channel.

6 Claims, 6 Drawing Sheets

WIRELESS BATTERY MANAGEMENT SYSTEM, MANAGER NODE FOR THE SAME, AND METHOD OF OPERATING CHANNEL

CROSS-REFERENCE TO RELATED APPLICATIONS

This application claims the benefit of the Korean Patent Applications No. 10-2019-0106984 filed on Aug. 30, 2019 and No. 10-2020-0100107 filed on Aug. 10, 2020, which are hereby incorporated by reference as if fully set forth herein.

FIELD

The present disclosure relates to a wireless battery management system, and more particularly, to a wireless battery management system, a manager node for the same, and a channel operating method, which operate a channel so as to stably support wireless communication in the wireless battery management system.

BACKGROUND

As the demand for portable electronic products such as notebook computers, video cameras, and portable phones increases rapidly and electric vehicles, storage batteries for storing energy, robots, and satellites are really developed, research on high-performance batteries capable of being repeatedly charged and discharged is being actively done.

A minimum unit of each battery may be referred to as a battery cell, and a plurality of battery cells serially connected to one another may configure a battery module. Also, a plurality of battery modules may be connected to one another in series or parallel, and thus, may configure a battery pack.

Generally, a battery pack equipped in electric vehicles and the like includes a plurality of battery modules connected to one another in series or parallel. The battery pack includes a battery management system which monitors a state of each of the battery modules and executes a control operation corresponding to the monitored state.

The battery management system includes a controller for obtaining and analyzing battery data. However, each of the battery modules included in the battery pack includes a plurality of battery cells, and due to this, there is a limitation in monitoring states of all of the battery cells included in the battery pack by using a single controller. Therefore, a method, where a controller is equipped in each of a certain number of battery modules included in a battery pack, one of the controllers is set as a master, and the other controllers are set as slaves, is being recently used for distributing a load of a controller and quickly and accurately monitoring a whole state of a battery pack.

A slave controller equipped in each of a certain number of battery modules is connected to a master controller over a wired communication network such as a control area network (CAN), collects battery data of a battery module controlled by the slave controller, and transmits the battery data to the master controller.

Technology, which sets a short-range wireless channel between the master controller and the slave controller and performs short-range wireless communication between the master controller and the slave controller, has been proposed for preventing the non-efficiency of a space occurring in a case where the CAN is built for communication between the master controller and the slave controller.

However, different wireless battery management systems may use the same communication channel, and in this case, interference or a wireless signal collision may occur between the wireless battery management systems. In a case where wireless battery management systems using the same channel are adjacent to each other, the master controller may not obtain battery data from the slave controller, or it may be unable to control the slave controller at a proper time, causing a problem where the total quality of a battery pack is degraded.

SUMMARY

Accordingly, the present disclosure is directed to providing a wireless battery management system, a manager node for the same, and a channel operating method that substantially obviate one or more problems due to limitations and disadvantages of the related art.

An aspect of the present disclosure is directed to providing a wireless battery management system, a manager node for the same, and a channel operating method, which prevent channel interference and a data collision.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a wireless battery management system including: a manager node establishing a first network being a short-range wireless network by using at least one of a first channel and a second channel, and when a second network using the same communication channel and modulation method as a communication channel and a modulation method of the first network is detected, changing the first channel to a third channel and changing the second channel to a fourth channel; and a monitor node transmitting battery data to the manager node by using at least one of the first channel and the second channel, and when channel change data including identification information about the third channel and identification information about the fourth channel are broadcasted from the manager node, transmitting the battery data to the manager node by using at least one of the third channel and the fourth channel.

In another aspect of the present disclosure, there is provided a manager node including: a first wireless communication unit configured to communicate through a primary channel being set to a first channel; a second wireless communication configured to communicate through a secondary channel being set to a second channel; and a controller establishing a first network being a short-range wireless network along with a monitor node by using at least one of a primary channel and a secondly channel and receiving battery data from the monitor node, and when a second network using the same communication channel and modulation method as a communication channel and a modulation method of the first network is detected, changing the first channel to a third channel and changing the second channel to a fourth channel.

In another aspect of the present disclosure, there is provided a channel operating method of a wireless battery management system, the channel operating method including: establishing a first network between a manager node and a monitor node by using at least one of a first channel and a second channel for collecting battery data, the first network being a short-range wireless network; monitoring whether a second network using the same communication channel and modulation method as a communication channel and a modulation method of the first network is detected; changing the first channel to a third channel and changing the second channel to a fourth channel when the second network is detected, the third channel and the fourth channel being randomly selected; and receiving the battery data from the monitor node by using at least one of the third channel and the fourth channel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
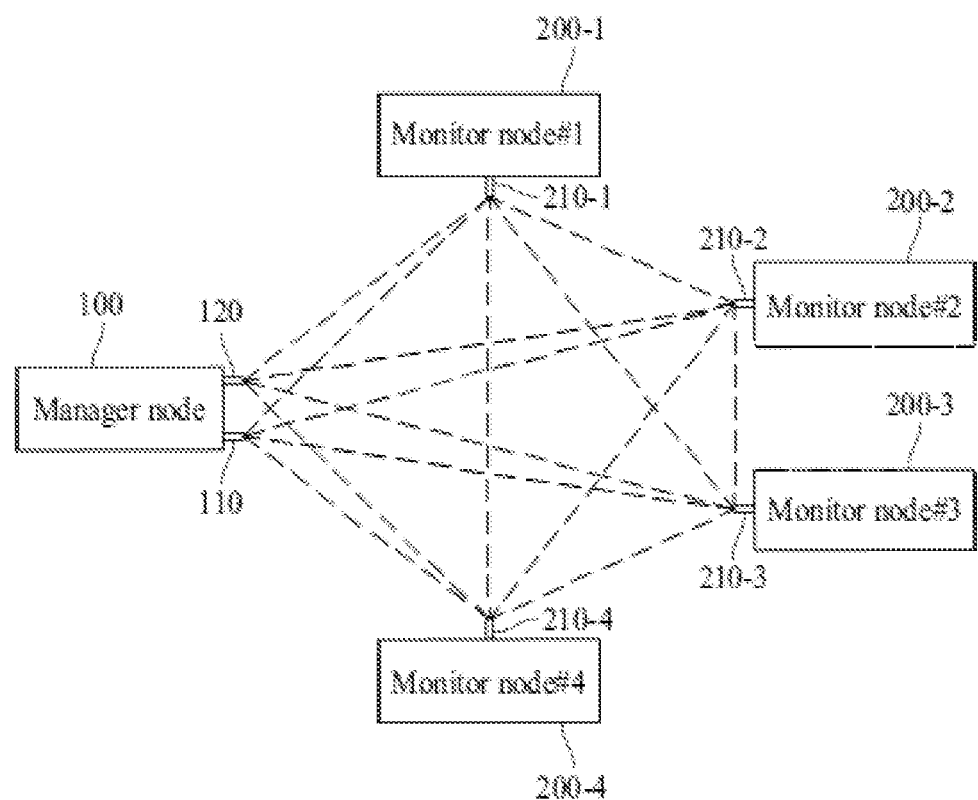
FIG. 1 is a diagram illustrating a wireless battery management system according to an embodiment of the present disclosure.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a diagram illustrating a wireless battery management system according to an embodiment of the present disclosure.

As illustrated in FIG. 1, the wireless battery management system according to an embodiment of the present disclosure may include a manager node 100 and a plurality of monitor nodes 200-N. The manager node 100 and each of the monitor nodes 200-N may perform wireless communication therebetween.

In the wireless battery management system according to an embodiment, the manager node 100 may include a controller set as a master, and each of the monitor nodes 200-N may include a controller set as a slave.

In an embodiment, the manager node 100 and each of the monitor nodes 200-N may perform wireless communication therebetween according to a short-range wireless communication protocol based on IEEE 802.15.4+. In another embodiment, the manager node 100 and each of the monitor nodes 200-N may perform wireless communication therebetween according to a protocol based on one of IEEE 802.11, IEEE 802.15, and IEEE 802.15.4, or may perform wireless communication therebetween according to a short-range wireless protocol based on another scheme.

Each of the monitor nodes 200-N may be equipped in one or more battery modules each including a set of battery cells and may collect battery data including a voltage, a current, a temperature, humidity, and the like occurring in the battery module. Also, each of the monitor nodes 200-N may autonomously inspect a state of a battery module equipped with a corresponding monitor node by measuring an analog front end (AFE) of the battery module and inspecting a state (i.e., diagnostic test) of the battery module, thereby generating a self-diagnosis data including an inspection result.

The monitor nodes 200-N may include a wireless communication unit 210-N. The wireless communication unit 210-N may first set a communication channel of the wireless communication unit 210-N to a first channel which is a primary channel, and then, may join in a short-range wireless network by using the primary channel to transmit battery data to the manager node 100. The monitor nodes 200-N may transmit the battery data to the manager node 100 during a dedicated slot assigned thereto. When the transmission of the battery data through the primary channel fails, the monitor nodes 200-N may change the first channel to a second channel which is a secondary channel, and then, may transmit the battery data to the manager node 100 by using the second channel.

Meanwhile, the monitor nodes 200-N may receive channel change data from the manager node 100. In this case, the monitor nodes 200-N may check identification information about the primary channel and identification information about the secondary channel, which are included in the channel change data and may change the communication channel of the wireless communication unit 210-N on the basis of the identification information about the primary channel to communicate with the manager node 100. Also, when the transmission of the battery data through the changed primary channel fails, the monitor nodes 200-N may change the communication channel of the wireless communication unit 210-N on the basis of the identification information about the secondary channel included in the channel change data and may transmit the battery data to the manager node 100 by using the changed communication channel.

The manager node 100 may receive battery data including one or more of a current, a voltage, a temperature, and self-diagnosis data from each of the monitor nodes 200-N and may analyze the received battery data to monitor a state of each battery module or a state of a battery pack. The manager node 100 may analyze the battery data of each battery module received from each of the monitor nodes 200-N to estimate the state (for example, state of charge (SOC) or state of health (SOH)) of each battery module and a whole state of the battery pack.

According to an embodiment of the present disclosure, the manager node 100 may include first and second wireless communication units 110 and 120. Each of the first and second wireless communication units 110 and 120 may include an antenna and a circuit for performing short-range wireless communication. The first wireless communication units 110 included in the manager node 100 may operate as a primary and the second wireless communication unit 120 may operate as a secondary. The first wireless communication unit 110 may establish a short-range wireless network along with each of the monitor nodes 200-N by using a first channel (a primary channel) based on a first frequency. The second wireless communication unit 120 may establish the short-range wireless network along with each of the monitor nodes 200-N by using a second channel (a secondary channel) based on a second frequency. Based on frequency interference between the primary channel and the secondary channel, the first frequency and the second frequency may be set to so that the difference between the first frequency and the second frequency is more than a predetermined value or more. Due to this, the primary channel and the secondary channel may be apart from each other.

Moreover, the manager node 100 may preferentially obtain the battery data of the battery module from each of the monitor nodes 200-N through the primary channel. When it is unable to communicate with a specific monitor node 200-N through the primary channel, the manager node 100 may obtain the battery data of the battery module from the specific monitor node 200-N through the secondary channel.

According to an embodiment of the present disclosure, the manager node 100 may establish the short-range wireless network for battery management. Also, the manager node 100 may check the number of monitor nodes 200-N joining in the short-range wireless network and may equally divide a transmission slot (see a transmission slot of FIG. 2) by the number of monitor nodes 200-N to generate one or more dedicated slots. The transmission slot may be a period which is assigned for data transmission by a plurality of monitor nodes, and the dedicated slot may be a period which is assigned to one monitor node and is available by only a single monitor node. Also, the short-range wireless network may be a personal network established based on the manager node 100, and a monitor node 200-N joining in the short-range wireless network may perform short-range wireless communication with the manager node 100. The number of monitor nodes 200-N joining in the short-range wireless network may be the same as the number of monitor nodes 200-N which are performing short-range wireless communication with the manager node 100.

The manager node 100 may communicate with the monitor nodes 200-N by using a data frame having a predefined format.

Figure 2:
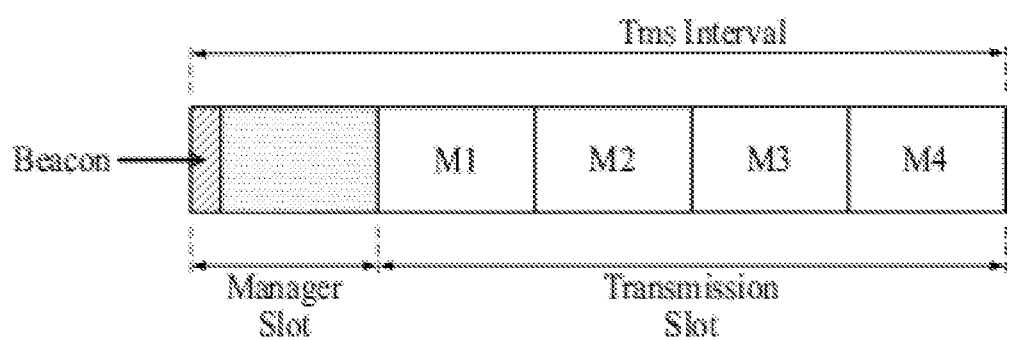
FIG. 2 is a diagram illustrating a data frame according to an embodiment of the present disclosure.

FIG. 2 is a diagram illustrating a data frame according to an embodiment of the present disclosure.

Referring to FIG. 2, a data frame used for wireless communication according to the present disclosure may include a plurality of time slots including a manager slot and a transmission slot and may have a certain time length Tms. A predetermined time period may be assigned to the manager slot and the transmission slot in the data frame, and an arrangement order of the manager slot and the transmission slot may be constant. In the data frame, a first-arranged manager slot may be a dedicated slot used for the manager node 100 and may include a beacon.

The beacon may perform a function of notifying the start of the data frame, and thus, may synchronize a slot timing. The manager node 100 may continuously transmit the beacon at a certain periodic interval. Each of the monitor nodes 200-N may recognize a start time of the data frame on the basis of the beacon and may extract the manager slot and the transmission slot each having a predetermined time from the data frame on the basis of the beacon.

A manager slot in the data frame may be a time slot which is used for the manager node 100 controlling the monitor nodes 200-N. During the manager slot, assignment information including a communication ID and dedicated slot information may be transmitted to the monitor nodes 200-N.

The transmission slot may be a time slot where battery data is transmitted and may be divided into a plurality of dedicated slots so as to be respectively assigned to the monitor nodes 200-N. The transmission slot may be equally divided into slots equal to the number of monitor nodes joining in the short-range wireless network (i.e., the number of monitor nodes which is communicating with the manager node), and a divided transmission slot (i.e., a dedicated slot)

may be assigned for a specific monitor node 200-N. In FIG. 2, it is illustrated that a transmission slot may be divided into four periods, and in this case, M1 may be a dedicated slot which is assigned to a monitor node #1 200-1, M2 may be a dedicated slot which is assigned to a monitor node #2 200-2, M3 may be a dedicated slot which is assigned to a monitor node #3 200-3, and M4 may be a dedicated slot which is assigned to a monitor node #4 200-4.

The manager node 100 may monitor whether another short-range wireless network having the same channel operating method is detected. When the another short-range wireless network is detected, the manage node 100 may randomly change a frequency of the primary channel and randomly change a frequency of the secondary channel. The manager node 100 may communicate with the monitor nodes 200-N by using one of a frequency-changed primary channel and a frequency-changed secondary channel. That is, the manager node 100 may randomly select a third channel and a fourth channel from among a plurality of available channels, change the primary channel from the first channel to the randomly-selected third channel, and change the secondary channel from the second channel to the randomly-selected fourth channel.

Figure 3:
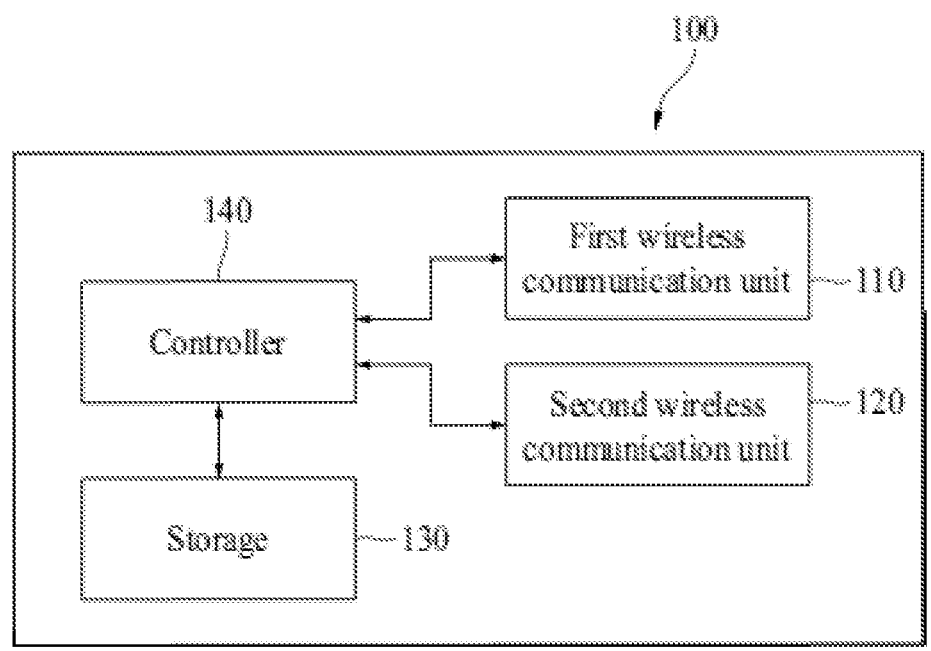
FIG. 3 is a diagram illustrating a configuration of a manager node according to an embodiment of the present disclosure.

FIG. 3 is a diagram illustrating a configuration of a manager node according to an embodiment of the present disclosure.

As illustrated in FIG. 3, the manager node 100 according to an embodiment of the present disclosure may include a first wireless communication unit 110, a second wireless communication unit 120, a storage 130, and a controller 140.

The first wireless communication unit 110 may be a primary wireless communication unit described above and may establish a primary channel along with the monitor nodes 200-N.

The second wireless communication unit 120 may be a secondary wireless communication unit described above and may establish a secondary channel along with the monitor nodes 200-N.

The first wireless communication unit 110 and the second wireless communication unit 120 may each include a radio frequency (RF) circuit for performing short-range wireless communication. Also, the first wireless communication unit 110 and the second wireless communication unit 120 may each broadcast a beacon at certain periods. A beacon transmitted by the first wireless communication unit 110 may have a transmission timing which is the same as or different from that of a beacon transmitted by the second wireless communication unit 120.

The storage 130 may be a storage means such as a disk device or a memory and may store various programs and data for operating the manager node 100. Particularly, the storage 130 may store a program (or an instruction set) where an algorithm for executing an operation of the manager node 100 is defined. Also, the storage 130 may store battery data received from each of the monitor nodes 200-N.

The controller 140, an operational processing device such as a microprocessor, may control an overall operation of the manager node 100. The controller 140 may load data associated with the program (or the instruction set) stored in the storage 130, to a memory and may monitor a state of a communication channel to change the communication channel.

The controller 140 may establish a short-range wireless network along with the monitor nodes 200-N by using one or more of the first wireless communication unit 110 and the second wireless communication unit 120, obtain battery data of each monitor node 200-N, and analyze the battery data to analyze states of battery modules equipped with the each monitor node 200-N. Also, the controller 140 may overall analyze each battery data to check a state of a battery pack, thereby controlling charging and discharging.

According to an embodiment of the present disclosure, the controller 140 may set a communication channel of the first wireless communication unit 110 to a first channel which is a primary channel and may establish a short-range wireless link along with each monitor node 200-N by using the first wireless communication unit 110. Also, the controller 140 may set a communication channel of the second wireless communication unit 120 to a second channel which is a secondary channel and may establish a short-range wireless link along with one or more monitor nodes 200-N by using the second wireless communication unit 120. Also, the controller 140 may communicate with the monitor nodes 200-N by preferentially using the first wireless communication unit 110, and when it is unable to communicate with a specific monitor node 200-N through the primary channel (i.e., using the first wireless communication unit 110), the controller 140 may communicate with the specific monitor node 200-N by using the secondary channel established by the second wireless communication unit 120.

The controller 140 may search for channels other than the primary channel and the secondary channel by using the second wireless communication unit 120 or the first wireless communication unit 110, evaluate the quality of each of the channels, and select a channel having best quality among the searched channels as an auxiliary primary channel. Also, the controller 140 may select a channel having best quality among channels which have a difference equal to or higher than a predetermined separation frequency (for example, 30 MHz) with respect to the auxiliary primary channel as an auxiliary secondary channel. The auxiliary primary channel and the auxiliary secondary channel may respectively be channels which are used as a primary channel and a secondary channel in a case where an operation of changing a channel is performed as the channel is degraded. The controller 140 may search for channels by using the first wireless communication unit 110 or the second wireless communication unit 120, and perform energy detection and frame detection on a frequency signal which is used in each of the searched channels. The controller 140 may apply a first weight value to an energy detection result value of a channel, apply a second weight value to a frame detection result value of the channel, and summate a weight-applied energy detection result value and a weight-applied frame detection result value to digitize the quality of each channel, thereby evaluating the quality of each channel.

The energy detection may be an operation of detecting an energy level of a frequency used in a corresponding channel. In the energy detection a dB-unit result value may be obtained, and as a dB value is higher, the amount of use of a channel may be high. Also, the frame detection may be an operation of detecting a data frame of another network using the same modulation method as that of the wireless battery management system according to the present disclosure, and in this case, frame detection or frame non-detection may be obtained as a result value.

To provide an additional description, the manager node 100 and the monitor nodes 200-N may modulate and transmit a data frame by using the same modulation/demodulation manner and may demodulate a modulated data frame. However, in a case where the manager node 100 normally demodulates a data frame occurring in another channel other than a primary channel and a secondary channel to recognize the data frame, the manager node 100 may determine that another network uses the other channel and may apply a low weight value to the other channel. When a preamble occurring in another network is detected and modulation is normally performed, the controller 140 may determine that a data frame of the another network is detected. As a result, a channel set to an auxiliary primary channel may be a channel where a data frame of another network is not detected and an energy level is lowest, and a channel set to an auxiliary secondary channel may be a channel, where the data frame of another network is not detected and an energy level is lowest, of channels which have a difference equal to or higher than a separation frequency with respect to the auxiliary primary channel.

The controller 140 may continuously monitor a state of a primary channel which is currently set. The controller 140 may check the degree of degradation of the primary channel by using one or more of the number of non-receptions of data, an energy detection result of the primary channel, and a frame detection result of the primary channel. In this case, the controller 140 may apply a third weight value to the number of non-receptions, apply a fourth weight value to the energy detection result of the primary channel, apply a fifth weight value to the frame detection result of the primary channel, and summate the weight-applied number of non-receptions, a weight-applied energy detection result, and a weight-applied frame detection result, thereby calculating the degree of degradation of the primary channel as a numerical value. The first weight value may be the same as the fourth weight value, and the second weight value may be the same as the fifth weight value.

When it is determined that a primary channel is degraded, the controller 140 may perform a channel changing operation according to a regular rule. In detail, when it is determined that the primary channel is degraded, the controller 140 may check identification information about each of an auxiliary primary channel and an auxiliary secondary channel which are currently selected and may broadcast channel change data, including the identification information about the auxiliary primary channel and the identification information about the auxiliary secondary channel, to the monitor nodes 200-N. In this case, the controller 140 may broadcast the channel change data by using all of the first wireless communication unit 110 and the second wireless communication unit 120 during a manager slot. Also, the controller 140 may add a channel change expectation time in the channel change data. At this time, the controller 140 may change a communication channel of the first wireless communication unit 110 to the auxiliary primary channel and change a communication channel of the second wireless communication unit 120 to the auxiliary secondary channel at the channel change expectation time. The channel change expectation time may include a time at which a channel is changed, or may include a timer time which elapses with respect to a current time.

The controller 140 may monitor the detection or not of another network having the same channel operating method as that of a short-range wireless network formed by the manager node 100. When a data frame of another network using the same modulation method is detected from the primary channel and an energy level of a second frequency detected through the secondary channel is higher than a threshold value, the controller 140 may determine that another short-range wireless network, which identically operates a channel, is detected.

When another network having the same channel operating method is detected, the controller 140 may change the communication channel of the first wireless communication unit 110 from a first channel to a third channel which is randomly selected and may change the communication channel of the second wireless communication unit 120 from a second channel to a fourth channel which is randomly selected. That is, the controller 140 may change a frequency of a primary channel from a first frequency to a third frequency and may change a frequency of a secondary channel from a second frequency to a fourth frequency, thereby avoiding a collision and interference with the another network. The third channel and the fourth channel may be channels which are randomly selected from among available channels.

When a plurality of vehicles equipped with the wireless battery management system according to the present disclosure are placed on the periphery, a first wireless battery management system and a second wireless battery management system may identically use a frequency of a primary channel and a frequency of a secondary channel. In this case, the first wireless battery management system and the second wireless battery management system may recognize that another short-range wireless network having the same channel operating method is on the periphery. In a case where a plurality of wireless battery management systems having the same channel operating method are neighbor, if a primary channel and a secondary channel are changed to an auxiliary primary channel and an auxiliary secondary channel respectively, interference or a collision may again occur in the auxiliary primary channel and the auxiliary secondary channel. The reason is because there is a high probability that the first wireless battery management system and the second wireless battery management system identically set an auxiliary primary channel and an auxiliary secondary channel by using the same best channel scan method. Therefore, in an embodiment of the present disclosure, when another network using the same channel operating method is detected, the controller 140 may randomly select a channel by using a random method without using the regular rule and may change each of a primary channel and a secondary channel to the randomly-selected channel, thereby avoiding interference and a collision with the another network.

Figure 4:
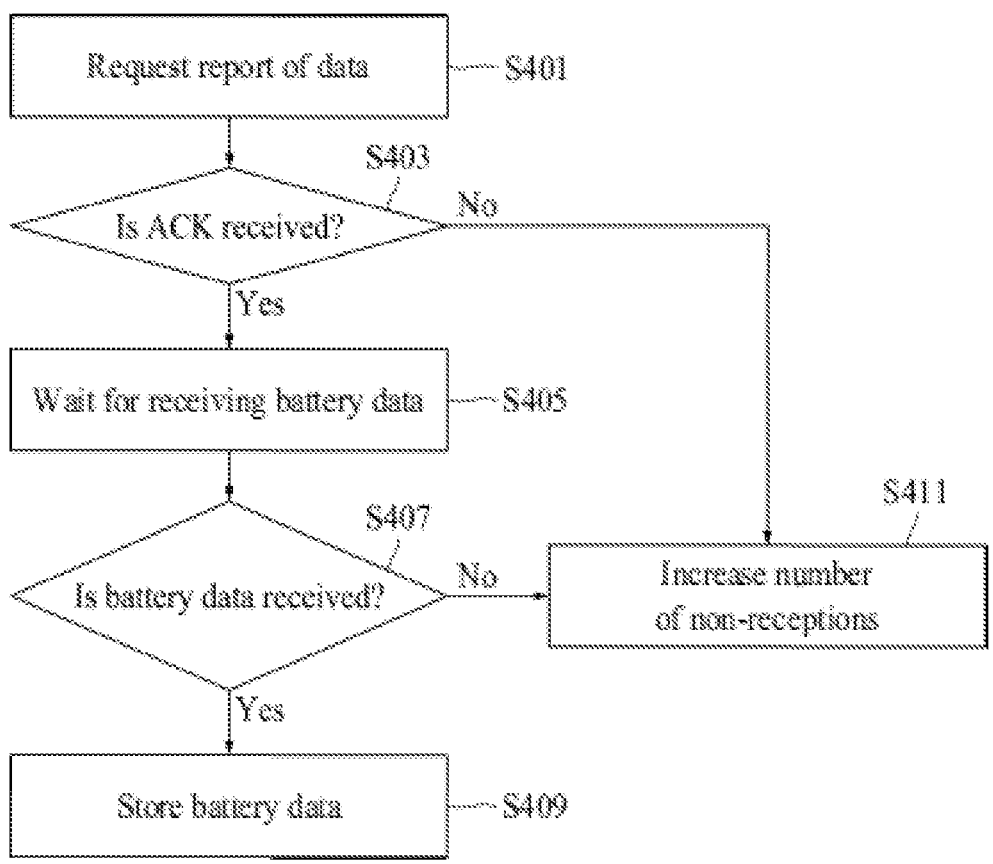
FIG. 4 is a flowchart describing a method of obtaining battery data by using a manager node, according to an embodiment of the present disclosure.

FIG. 4 is a flowchart describing a method of obtaining battery data by using a manager node, according to an embodiment of the present disclosure.

Referring to FIG. 4, in a state where the controller 140 sets the first wireless communication unit 110 to a primary channel (i.e., a first channel) based on a first frequency and sets the second wireless communication unit 120 to a secondary channel (i.e., a second channel) based on a second frequency, the controller 140 may transmit an instruction, issuing a request to report data during a manager slot, to a monitor node 200-N by using the primary channel and the secondary channel in operation S401.

Subsequently, the controller 140 may check whether an ACK, representing whether the instruction is received well, is received from all monitor nodes 200-N through the first wireless communication unit 110 and the second wireless communication unit 120. When there is a monitor node 200-N from which the ACK is not received in operation S403 (No), the controller 140 may increase the number of non-receptions on the basis of the number of ACKs which are not received in operation S411. The number of non-receptions may represent the number of non-responses of the monitor node 200-N which does not respond and may be used to calculate the degree of degradation of a primary channel. The controller 140 may check a monitor node 200-N from which the ACK is not received and may again transmit the instruction to a corresponding monitor node 200-N.

When the ACK is received from all monitor nodes 200-N in operation S403 (Yes), the controller 140 may wait for receiving battery data in operation S405. When battery data is omitted because battery data is not received from one or more monitor nodes 200-N in operation S407 (No), the controller 140 may increase the number of non-receptions on the basis of the number of omitted battery data in operation S411. That is, the controller 140 may increase the number of non-receptions on the basis of the number of monitor nodes 200-N which do not report battery data. The controller 140 may check a monitor node 200-N which does not transmit battery data and may again transmit the instruction to a corresponding monitor node 200-N.

When battery data based on the instruction is received from all monitor nodes 200-N, the controller 140 may store battery data received from each monitor node 200-N in the storage 130 in operation S409.

Figure 5:
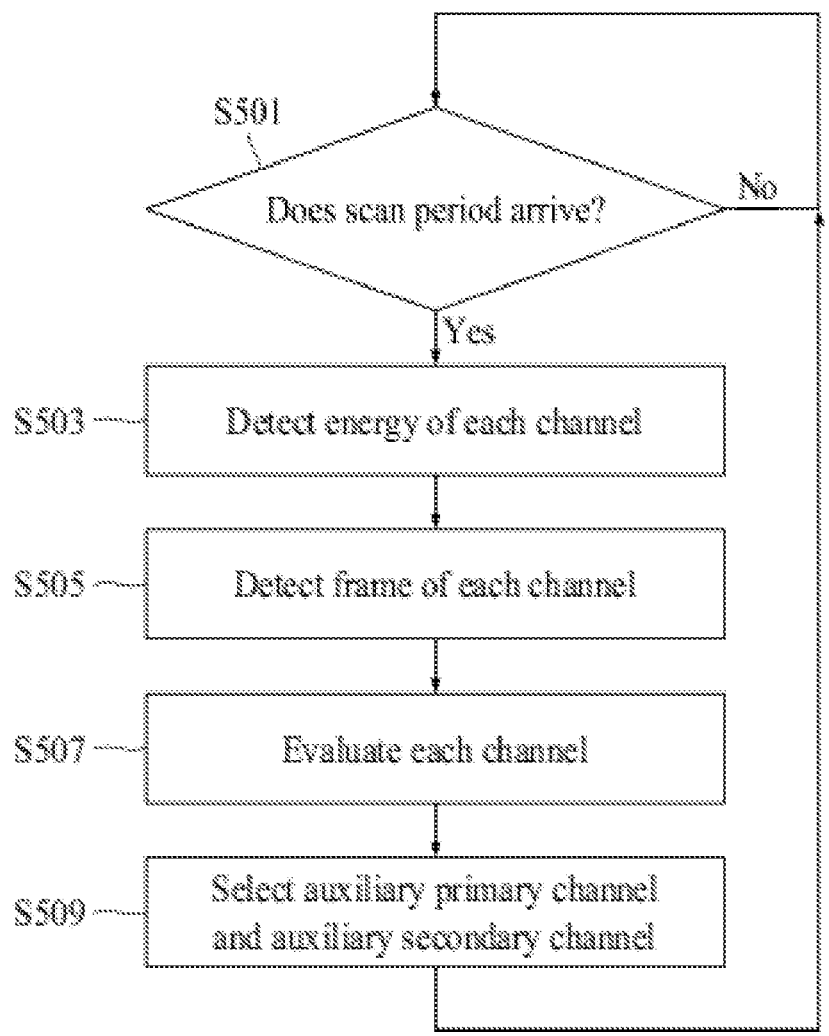
FIG. 5 is a flowchart describing a method of selecting an auxiliary channel by using a manager node, according to an embodiment of the present disclosure.

The above-described procedure of FIG. 4 may correspond to one cycle, and the controller 140 may repeat each of operations of FIG. 5 at a certain periodic interval.

FIG. 5 is a flowchart describing a method of selecting an auxiliary channel by using a manager node, according to an embodiment of the present disclosure.

Referring to FIG. 5, the controller 140 may check whether a scan period for searching a best channel arrives in operation S501. When the scan period arrives, the controller 140 may search for channels by using the first wireless communication unit 110 or the second wireless communication unit 120 and may perform energy detection on a frequency signal of each searched channel in operation S503. The controller 140 may check an energy level of the frequency signal of each channel as a result of the energy detection.

Subsequently, the controller 140 may perform data frame detection on each channel by using the first wireless communication unit 110 or the second wireless communication unit 120 and may check whether a data frame of another network is detected from each channel in operation S505. When a data frame modulated by the same modulation method as a modulation method used by the wireless battery management system according to the present invention is received, the controller 140 determines that the data frame of another network from a corresponding channel is detected. The received data frame may be a data frame received from an external network or external system, instead of a data frame which is generated in the wireless battery management system according to the present invention.

Subsequently, the controller 140 may apply a first weight value to an energy detection result (i.e., an energy level), apply a second weight value to a frame detection result value, and summate a weight-applied energy detection result and a weight-applied frame detection result to evaluate the quality of a corresponding channel. The first weight value may be applied to the energy detection result value so that a quality evaluation value of a channel increases as an energy detection result value of the channel is reduced, and when a frame is not detected in a channel, the second weight value may be applied to the frame detection result value so that the quality evaluation value of the channel increases. Accordingly, a channel where the data frame of another network is not detected and an energy detection result value is low may have a high grade.

The controller 140 may select a channel having best quality among the channels to an auxiliary primary channel and may select a channel having best quality among channels which have a difference equal to or higher than a predetermined separation frequency (for example, 30 MHz) with respect to the auxiliary primary channel to an auxiliary secondary channel in operation S509. As a result, a channel selected as the auxiliary primary channel may be a channel where the data frame of another network is not detected and an energy level is lowest, and a channel selected as an auxiliary secondary channel may be a channel where the data frame of another network is not detected and an energy level is lowest, of channels which have a difference equal to or higher than a separation frequency with respect to the auxiliary primary channel.

Scanning of a best channel may be repeated at a predetermined periodic interval, and thus, each of an auxiliary primary channel and an auxiliary secondary channel may be periodically changed. Also, the auxiliary primary channel and the auxiliary secondary channel may be used in a process of changing a channel according to the regular rule.

Figure 6:
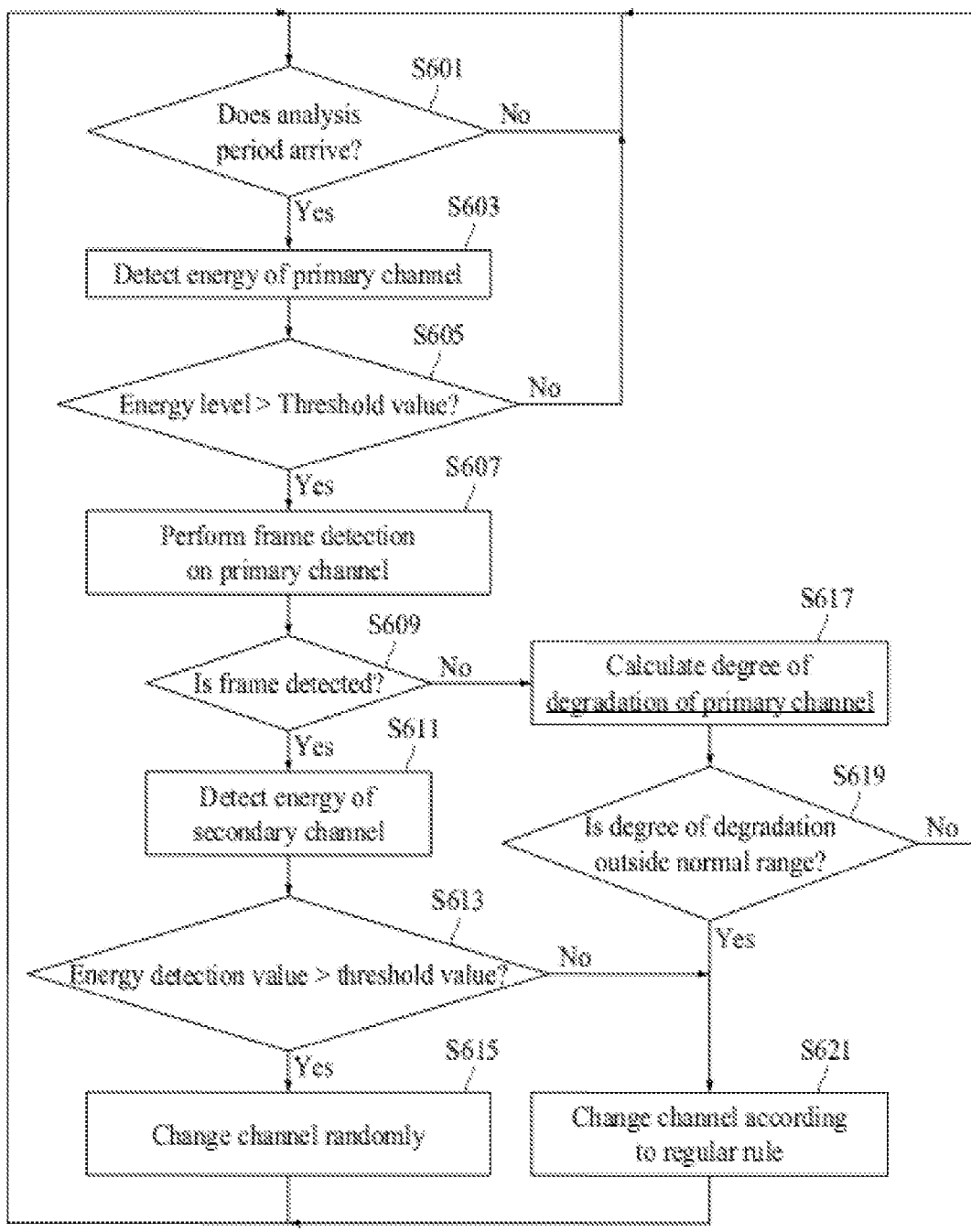
FIG. 6 is a flowchart describing a channel operating method of a wireless battery management system, according to an embodiment of the present disclosure.

FIG. 6 is a flowchart describing a channel operating method of a wireless battery management system, according to an embodiment of the present disclosure.

Referring to FIG. 6, the controller 140 may check whether a predetermined channel analysis period arrives in operation S601. When the channel analysis period arrives in operation S601, the controller 140 may perform energy detection using the first wireless communication unit 110 to check an energy level of a first frequency signal used for a primary channel in operation S603.

Subsequently, the controller 140 may check whether the checked energy level is greater than a predetermined threshold value in operation S605. When the checked energy level is greater than the predetermined threshold value in operation S605 (Yes), the controller 140 may perform frame detection on a primary channel by using the first wireless communication unit 110 in operation S607. That is, the controller 140 may check whether a data frame of another network modulated by the same modulation method as a modulation method used by the wireless battery management system according to the present invention is detected from the primary channel. When a preamble generated in another network is detected and normally modulated, the controller 140 may determine that the data frame of another network is detected.

The controller 140 may determine whether a data frame of another network is detected in operation S609. When the data frame of another network is detected in operation S609 (Yes), in order to determine whether another network uses the same channel operating method, the controller 140 may perform energy detection using the second wireless communication unit 120 to check an energy level of a second frequency signal used for a secondary channel in operation S611.

The controller 140 may check whether an energy level of the second frequency signal is greater than the threshold value in operation S613. When the energy level of the second frequency signal is greater than the threshold value in operation S613 (Yes), the controller 140 may determine that another network having the same channel operating method as that of the wireless battery management system according to the present invention is on the periphery. Subsequently, the controller 140 may randomly select a third channel and a fourth channel from among a plurality of available channels, instead of a first channel which is a primary channel and a second channel which is a secondary channel. That is, the controller 140 may randomly select the third channel having a third frequency and the fourth channel having a fourth frequency from among the plurality of available channels.

Also, the controller 140 may change a communication channel of the first wireless communication unit 110 from the first channel to the third channel based on the third frequency and may change a communication channel of the second wireless communication unit 120 from the second channel to the fourth channel based on the fourth frequency in operation S615. That is, when the data frame of another network based on the same modulation method is detected from the primary channel and an energy level equal to or greater than the threshold value is detected from the secondary channel, the controller 140 may determine that another network having the same channel operating method as that of the wireless battery management system according to the present invention is on the periphery and may randomly change the primary channel and the secondary channel instead of changing the primary channel and the secondary channel based on the regular rule.

The controller 140 may broadcast channel change data including identification information about the third channel, identification information about the fourth channel, and a channel change expectation time to a monitor node 200-N by using the first wireless communication unit 110 and the second wireless communication unit 120.

Then, the controller 140 may change the primary channel and the secondary channel at the channel change expectation time. In this case, the controller 140 may add information representing that the third channel is a channel used as the primary channel and the fourth channel is a channel used as the secondary channel in the channel change data. The monitor nodes 200-N which have received the channel change data may change a channel of the wireless communication unit 210-N from the first channel to the third channel set to the primary channel at the channel change expectation time. Also, when it is unable to perform communication using the third channel, the monitor nodes 200-N may change a communication channel of the wireless communication unit 210-N to the fourth channel set to the secondary channel and may perform communication.

When a data frame of another network having the same modulating method is not detected in operation S609, the controller 140 may calculate the degree of degradation of the primary channel (i.e., the first channel) in operation S617. The controller 140 may apply a third weight value to the number of non-receptions accumulated currently, apply a fourth weight value to the energy level of the first frequency signal which is an energy detection result value of the primary channel, apply a fifth weight value to a frame detection result of the primary channel. Then, the controller 140 summate the weight-applied number of non-receptions, a weight-applied energy detection result value, and a weight-applied frame detection result value, thereby calculating the degree of degradation of the primary channel as a numerical value. The first weight value may be the same as the fourth weight value, and the second weight value may be the same as the fifth weight value.

The controller 140 may check whether the calculated degree of degradation is outside a normal range in operation S619. When the calculated degree of degradation is within the normal range, the controller 140 may maintain the primary channel as the first channel and may maintain the secondary channel as the second channel, without changing a channel.

On the other hand, when the calculated degree of degradation is outside the normal range or the energy level of the secondary channel is equal to or less than the threshold value in operation S613, the controller 140 may change the communication channel of the first wireless communication unit 110 and the communication channel of the second wireless communication unit 120 according to the regular rule in operation S621. That is, based on identification information about each of an auxiliary primary channel and an auxiliary secondary channel which are currently selected, the controller 140 may change the communication channel of the first wireless communication unit 110 from the first channel to the auxiliary primary channel and may change the communication channel of the second wireless communication unit 120 from the second channel to the auxiliary secondary channel.

The controller 140 may broadcast channel change data including identification information about the auxiliary primary channel, identification information about the auxiliary secondary channel, and a channel change expectation time to a monitor node 200-N by using the first wireless communication unit 110 and the second wireless communication unit 120. Then, the controller 140 may change the primary channel and the secondary channel at the channel change expectation time. The monitor nodes 200-N which have received the channel change data may change a channel of the wireless communication unit 210-N from the first channel to the auxiliary primary channel at the channel change expectation time. Also, when it is unable to perform communication using the auxiliary primary channel, the monitor nodes 200-N may change a communication channel of the wireless communication unit 210-N to the auxiliary secondary channel and may communicate with the manager node 100.

A process illustrated in FIG. 6 may be performed during a period at which data is not transmitted or received between the monitor nodes 200-N and the manager node 100. That is, the wireless battery management system may perform the process of FIG. 6 during a period at which data is not generated in the wireless battery management system for more accurately performing energy detection and frame detection on the primary channel and the secondary channel.

According to the embodiments of the present disclosure, whether another network having the same channel operating method may be monitored, and when the another network is detected, a frequency of each of a primary channel and a secondary channel may be randomly changed to avoid a collision with the another network, thereby increasing the reliability of a wireless battery management system.

Moreover, according to the embodiments of the present disclosure, when a communication channel is unstable, the communication channel may be changed to a stable candidate channel which is obtained through channel search, and thus, the stability of a communication channel may be maximally maintained.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

All of the disclosed methods and procedures described in this disclosure can be implemented, at least in part, using one or more computer programs or components. These components may be provided as a series of computer instructions on any conventional computer readable medium or machine readable medium, including volatile and nonvolatile memory, such as RAM, ROM, flash memory, magnetic or optical disks, optical memory, or other storage media. The instructions may be provided as software or firmware, and may be implemented in whole or in part in hardware components such as ASICs, FPGAs, DSPs, or any other similar devices. The instructions may be configured to be executed by one or more processors or other hardware components which, when executing the series of computer instructions, perform or facilitate the performance of all or part of the disclosed methods and procedures.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A manager node comprising:
    a first wireless communication unit configured to communicate based on a first channel;
    a second wireless communication unit configured to communicate based on a second channel; and
    a controller configured to:
        establish a first network being a short-range wireless network along with a monitor node by using at least one of the first channel or the second channel;
        receive battery data from the monitor node;
        when a second network is detected, change the first channel to a third channel and change the second channel to a fourth channel, wherein a second modulation type and a second communication channel of the second network is same as a first modulation type and a first communication channel of the first network; and
        when the second network is not detected, calculate a degree of degradation of the first channel, wherein, when the degree of degradation is outside a normal range, the controller is further configured to change the first channel to an auxiliary first channel and change the second channel to an auxiliary second channel based on a channel scan.

2. The manager node of claim 1, wherein, when a data frame of the second network using the same modulation method as the modulation method of the first network is detected from the first channel and an energy level of a frequency of the second channel is greater than a threshold value, the controller determines that the second network is detected.

3. The manager node of claim 1, wherein the controller is configured to randomly select the third channel and the fourth channel from among a plurality of available channels.

4. The manager node of claim 1, wherein the controller is configured to detect an energy level of a frequency of the first channel and a data frame of the second network occurring in the first channel, check a number of non-receptions where one or more of ACK and battery data are not received from a monitor node, apply a weight value to each of the detected energy level, a detection result value of the data frame of the second network, and the number of non-receptions, and summate a weight-applied energy level, a weight-applied detection result value, and a weight-applied number of non-receptions to calculate the degree of degradation of the first channel.

5. The manager node of claim 1, wherein, by using the first wireless communication unit and the second wireless communication unit, the controller is configured to search channels other than the first channel and the second channel and select a channel, where a data frame of the second network is not detected therefrom and an energy level of a frequency thereof is lowest among searched channels as the auxiliary primary channel.

6. The manager node of claim 5, wherein the controller is configured to select, as the auxiliary secondary channel, a channel, where the data frame of the second network is not detected therefrom and an energy level of a frequency thereof is lowest among channels apart from the auxiliary primary channel by a separation frequency.

* * * * *